US008860598B2

(12) United States Patent
Thompson et al.

(10) Patent No.: US 8,860,598 B2
(45) Date of Patent: Oct. 14, 2014

(54) BIT ERROR RATE TIMER FOR A DYNAMIC LATCH

(71) Applicant: Analog Devices Technology, Hamilton (BM)

(72) Inventors: Frederick Carnegie Thompson, Foynes (IE); John Cullinane, Kilmallock (IE)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/839,972

(22) Filed: Mar. 15, 2013

(65) Prior Publication Data

US 2014/0266842 A1 Sep. 18, 2014

(51) Int. Cl.
*H03M 1/60* (2006.01)
*H03M 1/14* (2006.01)

(52) U.S. Cl.
CPC ....................................... *H03M 1/145* (2013.01)
USPC ........... 341/157; 341/137; 341/155; 341/160; 324/427; 320/132

(58) Field of Classification Search
CPC ......... H03M 1/186; H03M 3/38; H03M 1/20; H03M 1/0695; H03M 1/164; H03M 1/145; H03M 1/365; H03M 1/162; H03M 1/1009; H03M 1/0646; H03M 1/361; H03M 1/362; H03M 1/1033; H03M 1/1023; H03M 1/0624; H03M 1/1061; H03M 1/0863; H03M 1/205; H03M 1/367; H03M 3/438; H03M 3/356; H03M 3/424; H03K 3/35639; H03K 5/2481; H03K 5/249; H03G 3/3052; H03G 3/30; H03F 3/45188; H03F 2203/45302; H02J 7/0047; H02J 7/005; G01R 31/361
USPC .................... 341/110–160; 324/427; 320/132
See application file for complete search history.

(56) References Cited

U.S. PATENT DOCUMENTS

| | | | | |
|---|---|---|---|---|
| 4,763,106 A * | 8/1988 | Gulczynski | ................... | 341/141 |
| 4,910,518 A * | 3/1990 | Kim et al. | ...................... | 341/155 |
| 5,451,952 A * | 9/1995 | Yamazaki et al. | ............ | 341/158 |
| 5,684,486 A * | 11/1997 | Ono et al. | ...................... | 341/159 |
| 6,002,356 A * | 12/1999 | Cooper | ......................... | 341/160 |
| 6,072,416 A * | 6/2000 | Shima | ............................ | 341/159 |
| 6,369,547 B2 * | 4/2002 | Suzuki et al. | .................. | 320/132 |
| 6,441,587 B2 * | 8/2002 | Okada et al. | .................. | 320/136 |
| 6,617,191 B1 * | 9/2003 | Iwata et al. | ..................... | 438/50 |
| 7,187,317 B2 * | 3/2007 | Oka | .............................. | 341/156 |
| 7,649,486 B2 * | 1/2010 | Toyomura et al. | ............. | 341/159 |
| 8,350,737 B2 * | 1/2013 | Sanduleanu et al. | .......... | 341/120 |
| 8,493,254 B2 * | 7/2013 | Aoki | .............................. | 341/139 |
| 8,570,204 B2 * | 10/2013 | Bae et al. | ...................... | 341/158 |

* cited by examiner

*Primary Examiner* — Lam T Mai
(74) *Attorney, Agent, or Firm* — Kenyon & Kenyon, LLP

(57) ABSTRACT

A converter system, including a first converter that digitizes the a first portion of an input signal, the first converter including a comparator, a timer having a circuit structure that emulates a circuit structure of a comparator in the first converter, the timer receiving an input signal indicating commencement of operations in the comparator, a second converter that digitizes a second portion of the input signal remaining from the first portion in response to an output from the timer, and a combiner having inputs to generate a digital code from the digitized first and second portions.

22 Claims, 5 Drawing Sheets

100

300

200

500

400

BIT ERROR RATE TIMER FOR A DYNAMIC LATCH

BACKGROUND OF THE INVENTION

The present invention relates to electronic devices, and more particularly, to analog to digital converters (ADCs).

In certain electronic devices, ADCs are used for converting an analog signal into a digital format having one or more bits. Examples of such electronic devices include, but are not limited to, imaging, communication, and display devices. As can be expected, the ADC is a fundamental component of these electronic devices. Referring to the examples above, the ADC typically receives analog signals from a signal source (e.g., an antenna, a sensor, or a transducer), which is then converted by the ADC to a digital code representing the data.

An analog-to-digital converter (ADC) can use one of several architectures, such as a flash architecture, a delta-sigma architecture, and a pipelined architecture. Among the ADC architectures, the pipelined architecture is widely used in applications, such as video imaging systems, digital subscriber loops, Ethernet transceivers, and wireless communications. The pipelined ADC is also known as a sub-ranging ADC.

Some ADCs may include latch (or comparator) circuits as decision elements. When using multiple latches, it is necessary to have an indication of when the conversion is complete. As the number of latches in the ADC increases, additional logic is needed to generate a signal indicating that the analog to digital conversion has been completed. For example, a 4-bit flash ADC would require fifteen input gates, such as AND gates, to provide such an indication.

Another known architecture is the successive approximation register (SAR) ADC. A SAR ADC samples an input voltage and compares it to a plurality of threshold voltages on a bit-by-bit basis. When converting an analog voltage to a multi-bit digital codeword, a SAR ADC will perform one decision for each bit in the codeword. To this end, the SAR ADC often includes one or more capacitor arrays to store sampled voltages and to generate reference voltages and a comparator to compare the sampled voltage to each reference voltage and perform bit decisions. However, iterative operation of the SAR ADC limits the maximum conversion rate of the SAR ADC.

To maximize a conversion rate of an ADC, it may be necessary to ensure that components of the ADC will be utilized at the highest rates possible. Any time spent while ADC components are idle can lower the ADC's conversion rate. To this end, the inventor has identified a need in the art for an ADC that can determine when a first component of the ADC has completed an operation so that a subsequent component may commence operation.

DETAILED DESCRIPTION OF THE INVENTION

Embodiments of the present invention provide a timer for a dynamic latch for a fast switching analog to digital converter including a first converter that digitizes the first portion of an input signal, the first converter having a latch or latches, a second converter that generates an analog voltage corresponding to the first portion, the second converter coupled to a first subtractor that subtracts the first portion from the input signal to produce a residual portion, a comparator that iteratively compares the residual portion to one or more threshold voltages to digitize the residual portion, a combiner having inputs to receive the digitized first and residual portions, and a timer that tracks the timing of the latch to determine when the first portion has been digitized.

Figure 1:
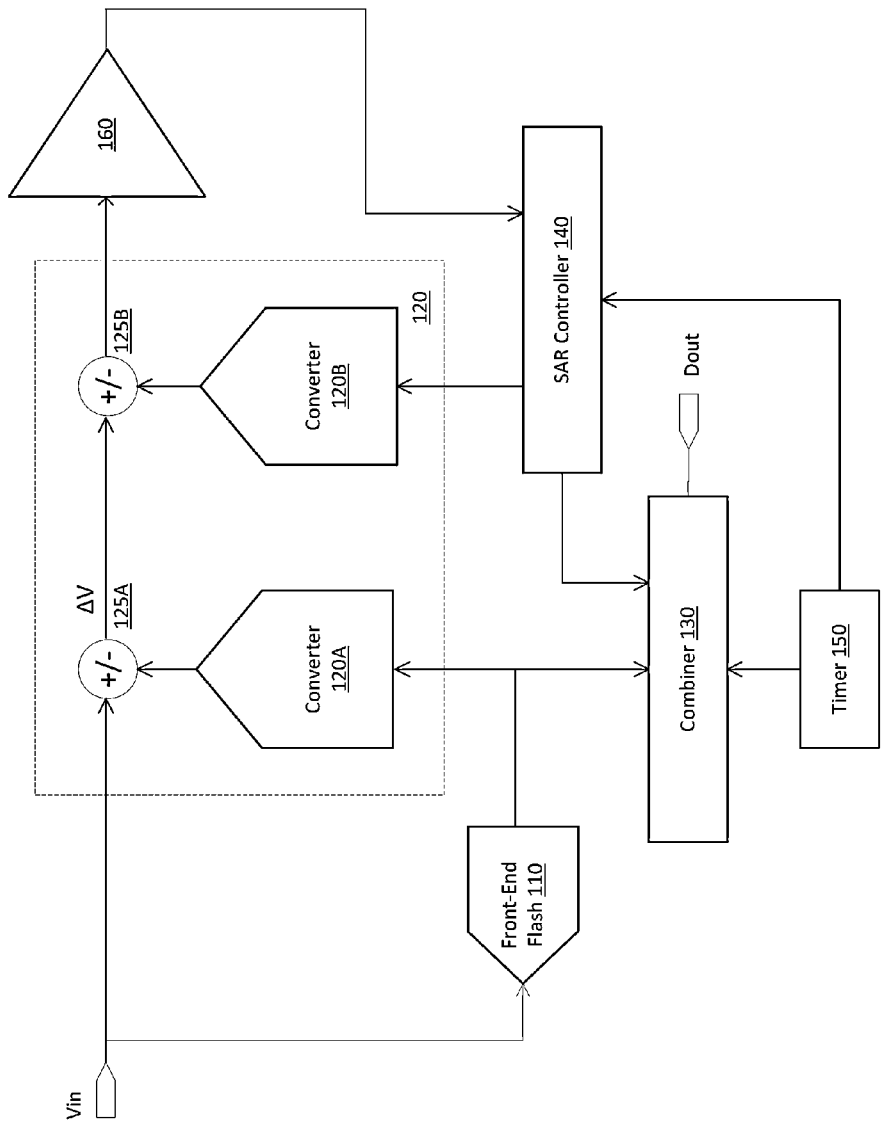
FIG. 1 illustrates a block diagram of an analog to digital conversion system according to an example embodiment of the present invention.

FIG. 1 illustrates a block diagram of an analog to digital converter system 100 according to an example embodiment of the present invention. The ADC system 100 includes a front-end converter 110, back-end converters 120, subtractors 125, SAR controller 140, digital combiner 130, timer 150, and comparator 160. In the embodiment illustrated in FIG. 1, the front-end converter 110 is illustrated as a flash ADC. The back-end converter 120 is illustrated as a Successive Approximation Register ("SAR") ADC.

The front-end converter 110 may digitize an input voltage $V_{in}$ to a coarse degree of precision and provide a digital output to the converter 120 and to digital combiner 130. The converter 120A may generate an analog voltage representing the digital value output by the front-end converter 110 and may output it to the subtractor 125A. The subtractor may generate a residual signal corresponding to a difference between the input signal $V_{in}$ and the output from the converter 110 (shown as $\Delta V$). The back-end comparator 160 combined with the converter 120 and SAR controller 140 may digitize the residual voltage $\Delta V$ and may output a digital value to the digital combiner 130. The digital combiner 130 may merge the values output from the front-end converters 110 and back-end comparator 160 and may output a digital value $D_{OUT}$ representing the converted input signal $V_{IN}$.

The timer 150 may provide a timing reference representing operation of the front-end converter 110. The timer 150 may emulate operation of circuit components within the front-end converter 110 and may generate a trigger signal that initiates subsequent stages of operation within the ADC 100. Thus, in the embodiment illustrated in FIG. 1, the timer 150 may initiate operation of the converter 120 and back-end comparator 160 via its connection to the SAR controller 140. The timer 150 itself may receive a clock signal or other signal that represents initiation of a conversion operation by the front-end converter 110.

A variety of ADC architectures may be used for the back-end converter 120. In the embodiment illustrated in FIG. 1, the back-end converter 120 is shown as an SAR ADC, which includes a subtractor 125, a comparator 160, a SAR controller 140 and digital to analog converters (DACs) 120A-B. As indicated, the SAR ADC may convert an input voltage (here, the residual voltage $\Delta V$) iteratively, using a plurality of test voltages that are developed by bit trials. On each iteration, the DAC 120B may generate an analog test voltage $V_{TEST}$ representing a test voltage for the present iteration. The subtractor 125B may generate a voltage representing a difference between the residual voltage ΔV and the test voltage VTEST. The comparator 160 may generate a binary signal from the voltage output by the subtractor, which may be stored in the SAR controller 140.

As discussed, the front-end converter 110 may be provided as a flash ADC that generates a coarse digital representation of the input signal VIN. A flash ADC that generates an N bit output may have $2^{N-1}$ comparators, each comparator corresponding to a quantization level of the N bit code. Each comparator typically compares the input voltage to a reference voltage that corresponds to the comparator's assigned quantization level. Response times of the comparators may vary based on a difference in the voltages that appear on the comparators' inputs and, thus, the comparators whose reference voltages are very different from the input voltage may resolve faster than a comparator whose reference voltage is very close the input voltage. In the ADC 100 of FIG. 1, the timer 150 may define a time window in which the front-end flash 110 is to complete operation to a predetermined Bit Error Rate (BER). If the timer 150 expires before a given flash converter resolves its input, the timer 150 may cause the subsequent stages of the ADC 100 (here, the DACs 120A-B) to begin operation without having received data from the converter.

Figure 2:
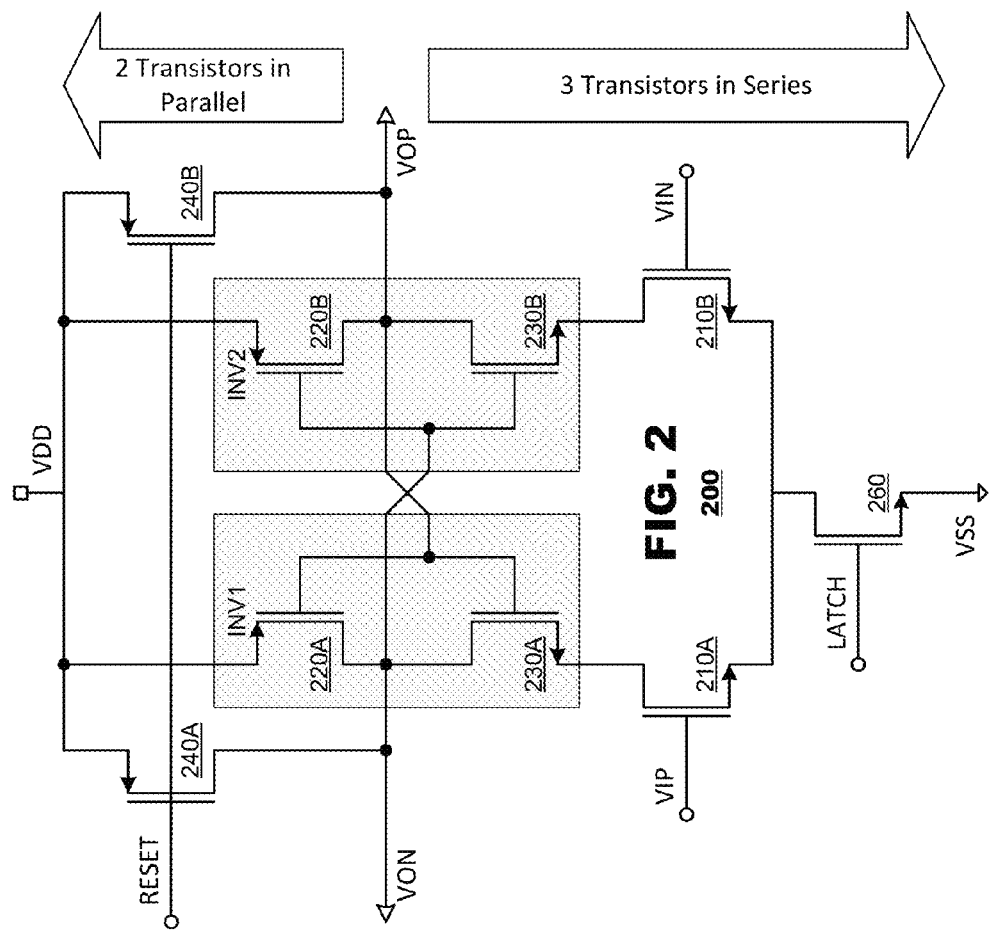
FIG. 2 illustrates a circuit diagram of a latch according to an example embodiment of the present invention.

FIG. 2 illustrates a circuit diagram of a comparator 200 according to an example embodiment of the present invention. The latch circuit 200 may include a pair of input transistors 210A, 210B, a pair of cross-coupled inverters INV1, INV2, a reset circuit RST and a control transistor 260. The inverters INV1, INV2 each may be formed of pair of transistors 220A/230A and 220B/230B. Output terminals VON, VOP may be coupled respectively to connections between each pair of transistors 220A/230A and 220B/230B. A first one of the transistors 220A, 220B in each inverter INV1, INV2 may provide a conductive path to a first supply voltage VDD of the comparator 200. A second one of the transistors 230A, 230B in each inverter INV1, INV2 may provide a conductive path, via a respective input transistor 210A, 210B, and control transistor 260 to a second voltage supply VSS of the comparator 200.

The reset circuit RST may be formed of reset transistors 240A, 240B that may be coupled between the first voltage supply VDD and respective output terminals VON, VOP. When activated, the reset transistors 240A, 240B may pull both output terminals to the supply voltage VDD.

The control transistor 260 may couple the second voltage supply to both the first and second input transistors 210A, 210B. In response to a control signal LATCH, the control transistor 260 may become conductive, which allows the input transistors 210A, 210B and inverters INV1, INV2 to drive the output terminals VON, VOP.

The input signals VIN, VIP are differential signals and may induce a differential output on the output terminals VON, VOP. Prior to conversion, the reset transistors 240A, 240B may drive the output terminals VON, VOP to the VDD voltage. Conversion may begin when the reset transistors 240A, 240B are rendered non-conductive and the control transistor 260 is rendered conductive. At that point, the output terminals VON, VOP may be pulled towards VSS via the input transistors 210A, 210B and inverter transistors 230A, 230B. The conductance of the input transistors 210A, 210B may vary based on the input voltages VIP, VIN respectively. One of the input transistors (say, 210A) may pull its associated output terminal (VON) to VSS faster than the other input transistor 210B. When this occurs, transistors 220B, 230B in the inverter INV2 may respond to the changing voltage at terminal VON. Transistor 220B may begin to conduct, which may pull output terminal VOP to VDD. Transistor 230B may cease to conduct, which may attenuate contribution of the input transistor 210B to the voltage at the output terminal VOP. Moreover, as the voltage on VOP returns to VDD, it may cause the transistors 220A in inverter INV1 to cease conducting and may cause the transistor 230A to become more conductive. Thus, in this example, output terminal VON may be pulled to VSS and output terminal VOP may be pulled to VDD.

In general, response time of the comparator 200 is proportional to the trans-conductance (gm) of the inverters INV1, INV2 and the capacitance on the output nodes of the comparator 200. However, the time constant may vary with process, supply voltage, and temperature effects present in the comparator when it is manufactured as an integrated circuit and used.

Figure 3:
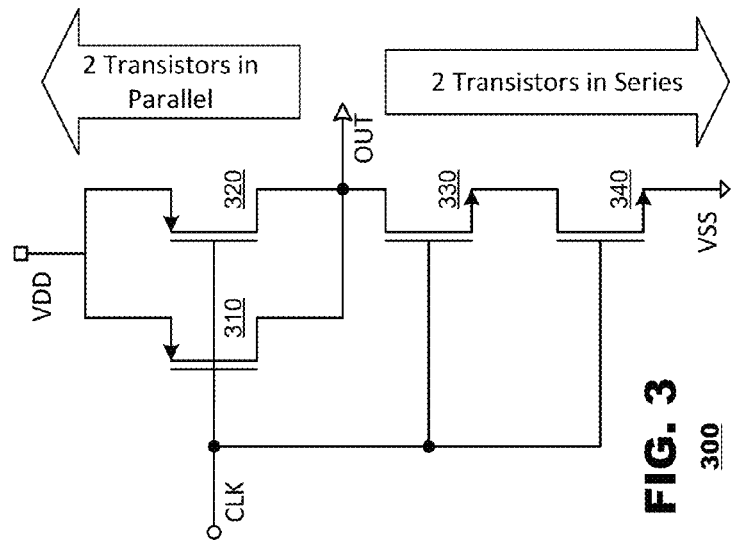
FIG. 3 illustrates a circuit diagram of a timer according to an example embodiment of the present invention.

FIG. 3 illustrates a circuit diagram of a timer 300 according to an example embodiment of the present invention. The timer 300 may find application with the comparator 200 of FIG. 2. The timer 300 may include two pairs of transistors 310/320 and 330/340 coupled to an output terminal OUT. The first pair of transistors 310, 320 may be coupled in parallel between the output terminals OUT and the first supply voltage VDD. The second pair of transistors 330, 340 may be coupled in series between the output terminal OUT and the second supply voltage VSS. All transistors may receive a common input, shown as a clock signal CLK.

The timer 300 may possess a circuit structure that is analogous to the comparator 200 in a few respects. The comparator's structure is similar to that of a NAND gate in the sense that a pair of series-coupled transistors 230A/210A and 230B/210B respectively connect the output terminals VON, VOP to the supply voltage VSS. These transistors are modeled as transistors 330, 340 in the timer 300. Transistor 260 is also in series, however, its conductivity is typically higher than that of transistors 210A/230A or 210B/230B and the effect of transistor 260 is lower than 210A/230A. Similarly, the transistors 220A, 220B in comparator 200 are in parallel with transistors 240A, 240B respectively, and are modeled as parallel-connected transistors 310, 320 in the timer 300. The transistors 330, 340 may be made conductive and the transistors 310, 320 may be made non-conductive when the input signal CLK is asserted. Thus, the circuit structure of FIG. 3 resembles that of a NAND gate in which both inputs are coupled to a common input signal CLK.

Transistors in the comparator 200 and the timer 300 may be manufactured to have similar structures and components (e.g., stacked NMOS transistors), so that they may share similar circuit properties. Also, MOSCAPS (i.e., MOS capacitors, not shown) can be set in the same ratio in both devices. Moreover, variations in process, supply voltage, and temperature should appear in common between the comparator 200 and the timer 300.

As a result, both the latch 200 and timer 300 should share similar timing as well as similar trans-conductance (gm) and drive strength. Thus, the timer 300 can be used to approximate the timing of the comparator 200.

In addition, timer cells of timer circuit 300 (and 500, as discussed below) can be cascaded to produce the time required for a particular bit error rate (BER). For example, if latch and timer cell time constants are equal, then cascading them will provide additional time constants and improved BER performance. This can be tuned by the designer to achieve the predetermined BER performance.

Figure 4:
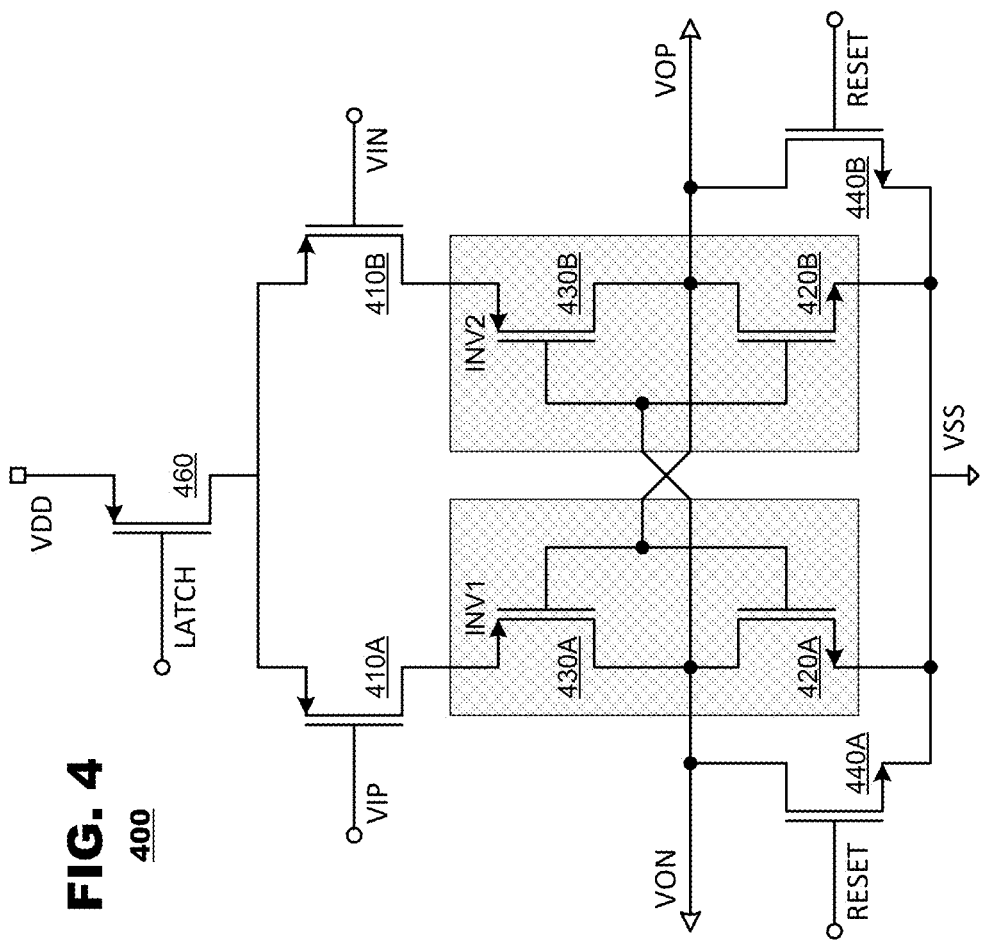
FIG. 4 illustrates a circuit diagram of a latch according to another example embodiment of the present invention.

FIG. 4 illustrates a circuit diagram of a comparator 400 according to another example embodiment of the present invention. The latch circuit 400 may include a pair of input transistors 410A, 410B, a pair of cross-coupled inverters INV1, INV2, a reset circuit RST and a control transistor 460. The inverters INV1, INV2 each may be formed of pair of transistors 420A/430A and 420B/430B. Output terminals VON, VOP may be coupled respectively to connections between each pair of transistors 420A/430A and 420B/430B. A first one of the transistors 430A, 430B in each inverter INV1, INV2 may provide a conductive path, via a respective input transistor 420A, 420B and the common control transistor 460 to a first supply voltage VDD of the comparator 400. A second one of the transistors 420A, 420B in each inverter INV1, INV2 may provide a conductive path to a second voltage supply VSS of the comparator 400.

The reset circuit RST may be formed of reset transistors 440A, 440B that may be coupled between the second voltage supply VDD and respective output terminals VON, VOP. When activated, the reset transistors 440A, 440B may pull both output terminals to the supply voltage VSS.

The control transistor 460 may couple the first voltage supply VDD to both the first and second input transistors 410A, 410B. In response to a control signal LATCH, the control transistor 460 may become conductive, which allows the input transistors 410A, 410B and inverters INV1, INV2 to drive the output terminals VON, VOP.

The input signals VIN, VIP are differential signals and may induce a differential output on the output terminals VON, VOP. Prior to conversion, the reset transistors 440A, 440B may drive the output terminals VON, VOP to the VSS voltage. Conversion may begin when the reset transistors 440A, 440B are rendered non-conductive and the control transistor 460 is rendered conductive. At that point, the output terminals VON, VOP may be pulled towards VDD via the input transistors 410A, 410B and inverter transistors 430A, 430B. The conductance of the input transistors 410A, 410B may vary based on the input voltages VIP, VIN respectively. One of the input transistors (say, 410A) may pull its associated output terminal (VON) to VDD faster than the other input transistors 410B. When this occurs, transistors 420B, 430B in the inverter INV2 may respond to the changing voltage at terminal VON. Transistor 420B may begin to conduct, which may pull output terminal VOP to VSS. Transistor 430B may cease to conduct, which may attenuate contribution of the input transistor 410B to the voltage at the output terminal VOP. Moreover, as the voltage on VOP returns to VSS, it may cause the transistors 420A in inverter INV1 to cease conducting and may cause the transistor 430A to become more conductive. Thus, in this example, output terminal VON may be pulled to VDD and output terminal VOP may be pulled to VSS.

In general, response time of the comparator 400 is proportional to the trans-conductance (gm) of the inverters INV1, INV2 and the capacitance on the output nodes of the comparator 400. However, the time constant may vary with process, supply voltage, and temperature effects present in the comparator when it is manufactured as an integrated circuit and used.

Figure 5:
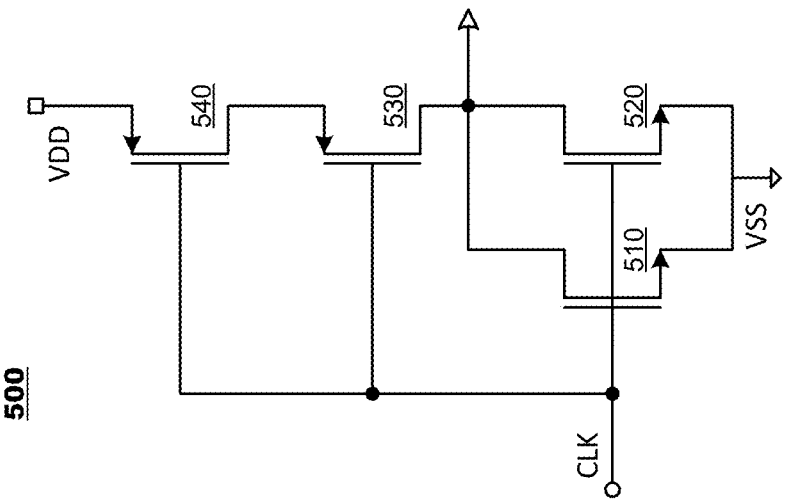
FIG. 5 illustrates a circuit diagram of a timer according to another example embodiment of the present invention.

FIG. 5 illustrates a circuit diagram of a timer 500 according to another example embodiment of the present invention. The timer 500 may find application with the comparator 400 of FIG. 4. The timer 500 may include two pairs of transistors 510/520 and 530/540 coupled to an output terminal OUT. The first pair of transistors 510, 520 may be coupled in parallel between the output terminals OUT and the first supply voltage VSS. The second pair of transistors 530, 540 may be coupled in series between the output terminal OUT and the second supply voltage VDD. All transistors may receive a common input, shown as a clock signal CLK.

The timer 500 may possess a circuit structure that is analogous to the comparator 500 in a few respects. Here, the comparator's structure is similar to that of a NOR gate in the sense that a pair of series-coupled transistors 430A/410A and 430B/410B respectively connect the output terminals VON, VOP to the supply voltage VDD. These transistors are modeled as transistors 530, 540 in the timer 500. Transistor 460 is also in series, however, its conductivity is typically higher than that of transistors 410A/430A or 410B/430B and the effect of transistor 460 is lower than 410A/430A. Similarly, the transistors 420A, 420B in comparator 400 are in parallel with reset transistors 440A, 440B, and are modeled as parallel-connected transistors 510, 520 in the timer 500. The transistors 530, 540 may be made non-conductive and the transistors 510, 520 may be made conductive when the input signal CLK is asserted. Thus, the circuit structure of FIG. 5 resembles that of a NOR gate in which both inputs are coupled to a common input signal CLK.

Transistors in the comparator 400 and the timer 500 may be manufactured to have similar structures and components (e.g., stacked NMOS transistors), so that they may share similar circuit properties. Also, MOSCAPS (i.e., MOS capacitors, not shown) can be set in the same ratio in both devices. Moreover, variations in process, supply voltage, and temperature should appear in common between the comparator 400 and the timer 500.

As a result, both the latch 400 and timer 500 should share similar timing as well as similar trans-conductance (gm) and drive strength. Thus, the timer 500 can be used to approximate the timing of the comparator 400.

Figure 6:
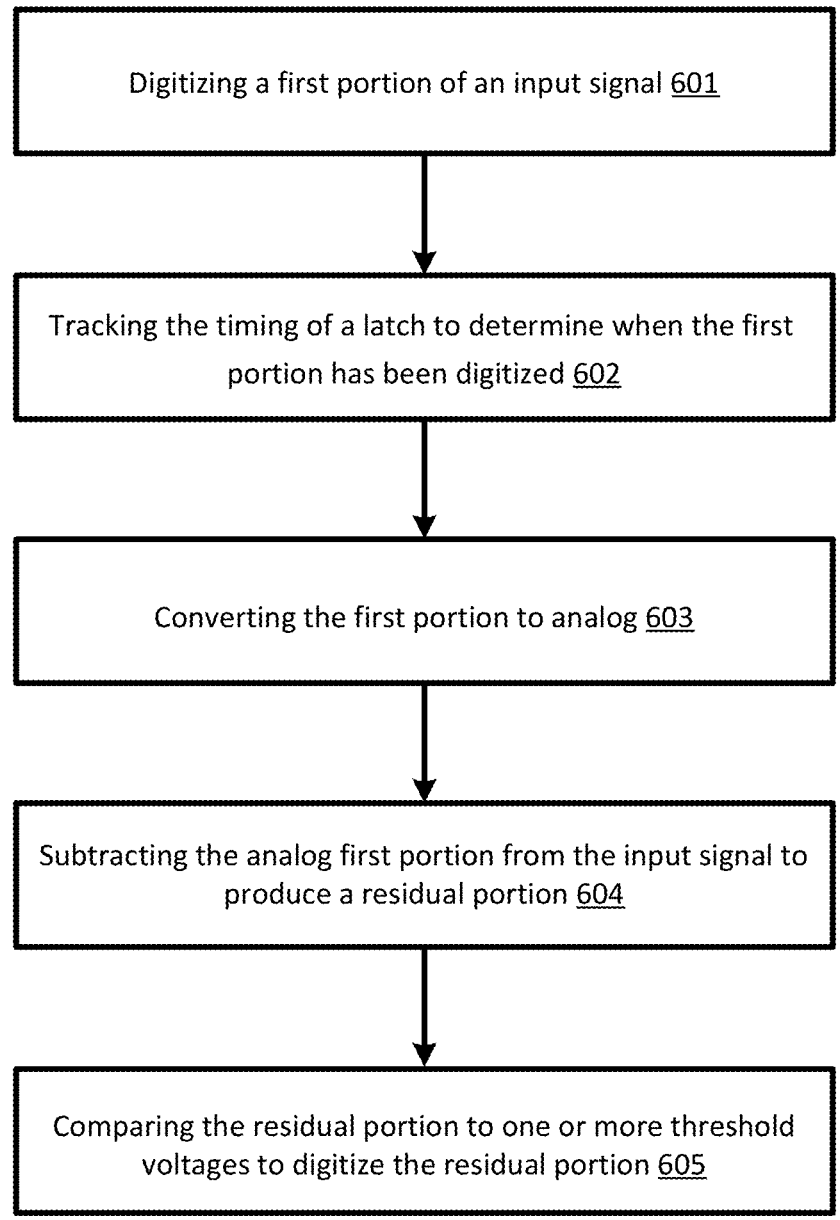
FIG. 6 illustrates a method according to an example embodiment of the present invention.

FIG. 6 illustrates a method according to an example embodiment of the present invention.

At 601, the front-end flash having latch circuits (more than one) digitizes a first portion of an input signal. In particular, the front-end flash of the ADC system compares the sampled input voltage $V_{in}$ against one or more threshold values to determine the most significant bits (MSBs) of the digitized input voltage $V_{in}$. After the MSBs are generated, the front-end flash transmits the MSBs to a digital-to-analog converter.

Next, at 602, a timer tracks the timing of the latch to determine when the MSB portion has been digitized. By tracking when the MSB portion has been digitized to a predetermined BER, it becomes unnecessary to generate a signal based on the completion of each comparator. As a result, additional logic is no longer needed to determine whether a conversion has been completed and additional time delays from this logic is not incurred. When the timer generates a control signal, an analog voltage corresponding to the MSBs from the front-end flash can be generated.

At 603, a converter generates an analog voltage corresponding to the MSBs from the front end flash, so that the MSBs can be subtracted out of the input signal. Here, at 604, the analog first portion is subtracted from the original input signal to produce a residual portion. Lastly, at 605, a comparator compares the residual portion to one or more threshold voltages to digitize the residual portion. The residual portion is digitized on a bit-by-bit basis. The residual voltage is compared threshold voltages to generate multiple bit decisions corresponding to the lesser significant bit positions of the codeword. When converting the residual voltage to a multi-bit digital codeword, one decision is performed for each residual bit in the codeword. As the residual bits are determined, the residual bits can be transmitted to a combiner that operates to add residual bits to the MSB determined by the front-end flash.

Figure 7:
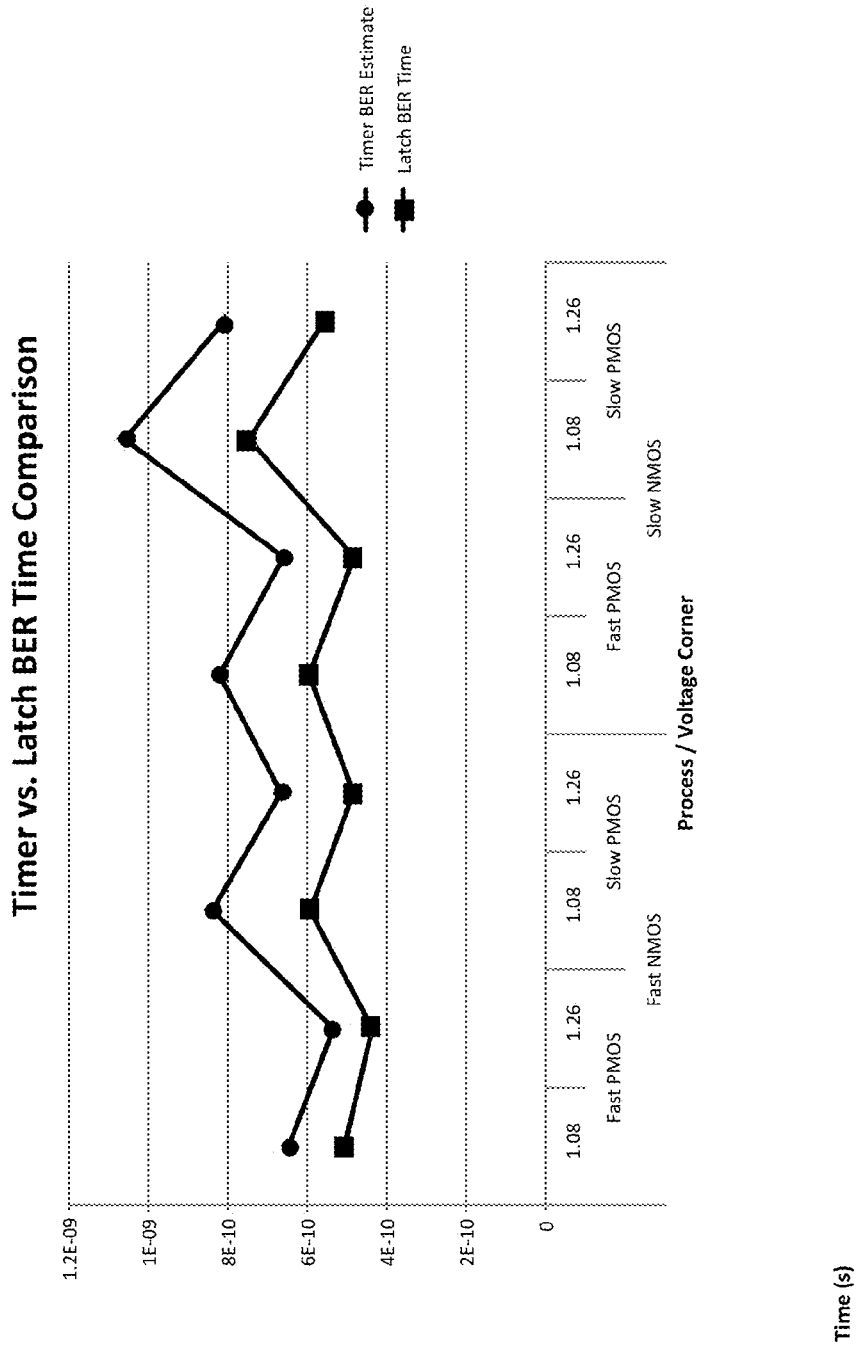
FIG. 7 illustrates a graph comparing the timing of latch and timer circuits according to an example embodiment of the present invention.

FIG. 7 illustrates a graph comparing the timing of latch and timer circuits according to an example embodiment of the present invention. The graph of FIG. 7 compares the time required by a timer cell to the time required by a latch. As shown, the timer 300 or 500 effectively tracks the timing of a latch 200 or 400, respectively, within front-end flash 110.

While specific implementations and hardware/software configurations for the multichannel ADC have been illustrated, it should be noted that other implementations and hardware/software configurations are possible and that no specific implementation or hardware/software configuration is needed. Thus, not all of the components illustrated may be needed for the device implementing the methods disclosed herein.

It will be apparent to those skilled in the art that various modifications and variations can be made in the bit error rate timer scheme for fast channel switching analog to digital converters of the present invention without departing from the spirit or scope of the invention. Thus, it is intended that the present invention cover the modifications and variations of this invention provided they come within the scope of the appended claims and their equivalents.

We claim:

1. A converter system, comprising:
   a first converter that digitizes a first portion of an input signal, the first converter including a comparator;
   a timer having a circuit structure that emulates a circuit structure of a comparator in the first converter, the timer receiving an input signal indicating commencement of operations in the comparator and generating an output signal representing conclusion of the operations in the comparator, wherein the timer allocates time sufficient to achieve a predetermined bit error rate;
   a second converter that digitizes a second portion of the input signal remaining from the first portion in response to the output signal from the timer; and
   a combiner having inputs to generate a digital code from the digitized first and second portions.

2. A converter system, comprising:
   a first converter that digitizes a first portion of an input signal, the first converter including a comparator;
   a timer having a circuit structure that emulates a circuit structure of a comparator in the first converter, the timer receiving an input signal indicating commencement of operations in the comparator;
   a second converter that digitizes a second portion of the input signal remaining from the first portion in response to an output from the timer; and
   a combiner having inputs to generate a digital code from the digitized first and second portions,
   wherein the timer includes an output terminal coupled to a first voltage supply by a pair of series-connected transistors and coupled to second supply voltage by a pair of parallel-connected transistors.

3. The converter according to claim 2, wherein the timer is a NAND gate having its inputs connected together.

4. The converter according to claim 2, wherein the timer is a NOR gate having its inputs connected together.

5. A converter system, comprising:
   a first converter that digitizes a first portion of an input signal, the first converter including a comparator;
   a timer having a circuit structure that emulates a circuit structure of a comparator in the first converter, the timer receiving an input signal indicating commencement of operations in the comparator;
   a second converter that digitizes a second portion of the input signal remaining from the first portion in response to an output from the timer; and
   a combiner having inputs to generate a digital code from the digitized first and second portions,
   wherein circuit components the timer and the comparator have are approximately equal trans-conductance in ratio to their respective output capacitances.

6. A converter system, comprising:
   a first converter that digitizes a first portion of an input signal, the first converter including a comparator;
   a timer having a circuit structure that emulates a circuit structure of a comparator in the first converter, the timer receiving an input signal indicating commencement of operations in the comparator;
   a second converter that digitizes a second portion of the input signal remaining from the first portion in response to an output from the timer; and
   a combiner having inputs to generate a digital code from the digitized first and second portions,
   wherein transistors in the timer and transistors in the comparator have approximately equal drive strength in ratio to their respective output capacitances.

7. The converter according to claim 1, wherein the combiner produces a digital codeword.

8. The converter according to claim 1, wherein the first converter is a flash analog to digital converter.

9. The converter according to claim 1, wherein the second converter is a SAR ADC.

10. The converter according to claim 1, wherein the second converter is a pipelined ADC.

11. The converter according to claim 1, wherein the second converter is a sigma-delta ADC.

12. A flash converter, comprising:
    a plurality of comparators, each comparing an input voltage to a respective reference voltage,
    a timer having a circuit structure that emulates a circuit structure of the comparators the timer receiving an input signal indicating commencement of operation in the comparators and generating an output signal representing conclusion of the operations in the comparators wherein the timer allocates time sufficient to achieve a predetermined bit error rate.

13. The converter according to claim 11, wherein the timer includes an output terminal coupled to a first voltage supply by a pair of series-connected transistors and coupled to second supply voltage by a pair of parallel-connected transistors.

14. The converter according to claim 11, wherein the timer is a NAND gate having its inputs connected together.

15. The converter according to claim 11, wherein the timer is a NOR gate having its inputs connected together.

16. A method for operating a analog to digital converter, comprising:
    digitizing, by first converter a first portion of an input signal;
    converting the first portion to analog, by a second converter;
    subtracting, by a first subtractor, the analog first portion from the input signal to produce a residual portion;
    comparing, by a comparator, the residual portion to one or more threshold voltages to digitize the residual portion;
    combining, by a combiner, digitized first and residual portions; and
    tracking, by a timer, timing of a latch of the first converter to determine when the first portion has been digitized, where the timer allocates time sufficient to achieve a predetermined bit error rate.

17. The method according to claim 16, wherein the first converter is a flash analog to digital converter.

18. The method according to claim 16, wherein the timer includes a pair of series transistors coupled to a pair of parallel transistors.

19. The method according to claim 16, wherein the timer and the latch have are approximately equal trans-conductance in ratio to their respective output capacitances.

20. The method according to claim 16, wherein the timer and the latch have approximately equal drive strength in ratio to their respective output capacitances.

21. The method according to claim 16, wherein the first portion includes most significant bits.

22. The method according to claim 16, wherein the combiner produces a digital codeword.

* * * * *